United States Patent
Trionfetti

(10) Patent No.: US 12,422,282 B2
(45) Date of Patent: Sep. 23, 2025

(54) MEASURING HEAD

(71) Applicant: BALANCE SYSTEMS S.r.l., Milan (IT)

(72) Inventor: Gianni Trionfetti, Agrate Brianza (IT)

(73) Assignee: BALANCE SYSTEMS S.R.L., Milan (IT)

( * ) Notice: Subject to any disclaimer, the term of this patent is extended or adjusted under 35 U.S.C. 154(b) by 197 days.

(21) Appl. No.: 18/483,975

(22) Filed: Oct. 10, 2023

(65) Prior Publication Data

US 2025/0116536 A1    Apr. 10, 2025

(51) Int. Cl.
*G01D 5/24* (2006.01)
*G01B 5/28* (2006.01)
*G01R 27/26* (2006.01)

(52) U.S. Cl.
CPC ........... *G01D 5/24* (2013.01); *G01R 27/2605* (2013.01); *G01B 5/28* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; G01B 5/00; G01B 5/28
USPC .................. 324/600, 649, 658, 686
See application file for complete search history.

(56) References Cited

U.S. PATENT DOCUMENTS

| | | | |
|---|---|---|---|
| 4,760,403 A * | 7/1988 | Grim ................ | H01P 1/165 343/789 |
| 4,813,430 A * | 3/1989 | Hecox ............... | A61B 5/12 181/135 |
| 7,936,176 B2 * | 5/2011 | Nielsen ............. | G01R 1/07392 438/18 |
| 10,959,630 B1 * | 3/2021 | Keller ............... | H04R 1/105 |
| 11,995,269 B2 * | 5/2024 | Chen ................ | G06F 3/0412 |
| 2003/0034453 A1 * | 2/2003 | Ookubo ............ | B82Y 35/00 850/1 |
| 2003/0132744 A1 * | 7/2003 | Nightingale ...... | G01R 1/06788 324/755.01 |

FOREIGN PATENT DOCUMENTS

| | | | | | |
|---|---|---|---|---|---|
| CN | 207908009 U | * | 9/2018 | ........ | G01S 7/2922 |
| CN | 110297110 A | * | 10/2019 | ........ | G01R 1/073 |
| CN | 111417463 A | * | 7/2020 | ........ | G01N 35/10 |

(Continued)

*Primary Examiner* — Hoai-An D. Nguyen
(74) *Attorney, Agent, or Firm* — NIXON & VANDERHYE

(57) ABSTRACT

There is provided a measuring head comprising a support frame, an arm extending along a trajectory at least between a first end and a second end and including at least one probe arranged at said first end and suitable for contacting an external body, constraint means configured to loosely bind said frame and said arm in such a manner that said arm is rotatable with respect to said frame about a rotation axis, transversal to said trajectory proportional to displacements defined by the interaction of said probe with said body, and a differential capacitive sensor comprising an emitter integral with said frame and disposed in proximity of said second end, a receiver integral with said second end and a computer operatively connected to the receiver and configured to determine position parameters of the receiver with respect to the emitter from a predetermined reference position value so as to determine the displacements of the probe.

10 Claims, 2 Drawing Sheets

(56) References Cited

FOREIGN PATENT DOCUMENTS

| CN | 119001187 A | * | 11/2024 | ............. B23K 37/00 |
| --- | --- | --- | --- | --- |
| GB | 2515693 A | * | 12/2014 | ............. G01B 5/012 |
| TW | I842533 B | * | 5/2024 | ......... G01R 1/07342 |
| WO | WO-0003252 A2 | * | 1/2000 | ......... G01R 1/06733 |

* cited by examiner

MEASURING HEAD

FIELD OF THE INVENTION

The present invention relates to a measuring head including: a support frame, an arm extending along a trajectory at least between a first end and a second end and including at least one probe arranged at the first end and suitable for contacting an external body, constraint means configured to loosely bind the frame and the arm in such a manner that the arm is rotatable with respect to the frame about an axis of rotation, transverse to the trajectory, in proportion to displacements defined by the interaction of the probe with the body.

In particular, the present invention relates to a measuring head configured to determine the relative displacement between a probe, moved for example by interaction with an object, and a fixed support frame.

DESCRIPTION OF THE PRIOR ART

As is well known, measuring heads are instruments for measuring roughness, unbalance or. more banally, the displacement of a body by means of a moving probe in contact with the body.

The touch probe is generally connected to a swing arm relative to a fixed frame.

Thus, the displacement of the touch probe in relation to the interference with the body can be determined by means of sensors.

The sensor media usually adopted are basically inductive displacement transducers, also known as LVDTs.

These transducers comprise, in the main, a tube consisting of three windings with parallel axes and surrounding a ferromagnetic cylindrical core moving parallel to the axes. In addition, the cylindrical core is normally characterised by high magnetic permeability.

In detail, the central winding is called the primary winding and is connected to an AC voltage generator, while the other two windings are called the secondary windings and allow the output voltage to be measured at their ends for the variable in relation to core displacement.

Thus, the electrical signal is essentially proportional to a linear displacement of the core and, therefore, it is possible to transmit the information to external processors and translate the proportional signal back into the found displacement value.

The known art described includes some major drawbacks.

In particular, LVDT sensors are expensive and therefore economically disadvantageous.

Furthermore, LVDT sensors generally have their own range, however sensitive they may be, and involve mechanical impediments that primarily limit the available travel.

In this situation, the technical task underlying the present invention is to devise a measuring head capable of substantially obviating at least some of the aforementioned drawbacks.

Within this technical task, it is an important aim of the invention to obtain a measuring head that is simple and inexpensive to manufacture.

Another important aim of the invention is to realise a measuring head that is not affected by mechanical limitations or hindrances and allows for a longer stroke, i.e. to estimate larger displacements.

In addition, another task of the invention is to realise a measuring head with reduced mechanical dimensions for the above-mentioned advantages.

In conclusion, a further aim of the invention is to realise a measuring head that allows the measurement to be linearised.

SUMMARY OF THE INVENTION

The technical task and specified purposes are achieved by a measuring head including: a support frame, an arm extending along a trajectory at least between a first end and a second end and including at least one probe arranged at the first end and suitable for contacting an external body, constraint means configured to loosely bind the frame and the arm in such a manner that the arm is rotatable with respect to the frame about an axis of rotation, transverse to the trajectory, in proportion to displacements defined by the interaction of the probe with the body; and a capacitive differential sensor including: an emitter integral with the frame and disposed in proximity of the second end, a receiver integral with the second end, and a computer operatively connected to the receiver and configured to determine position parameters of the receiver with respect to the emitter from a predetermined reference position value so as to determine the displacements of the probe.

BRIEF DESCRIPTION OF THE DRAWINGS

The features and advantages of the invention are clarified below by a detailed description of preferred embodiments of the invention, with reference to the accompanying drawings, in which.

DESCRIPTION OF THE PREFERRED EMBODIMENTS

Figure 1:
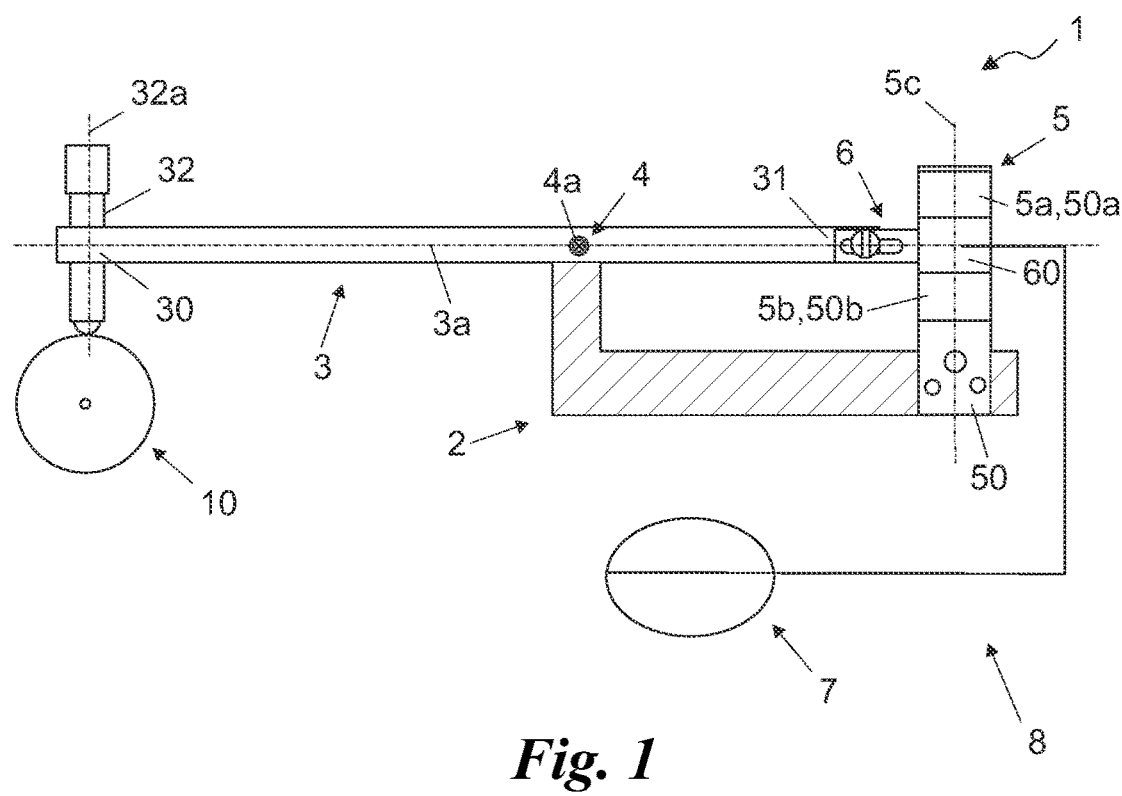
FIG. 1 shows a schematic side view of a measuring head according to the invention with the cursor positioned at the predetermined reference position value that returns a null resultant signal.

In this document, measurements, values, geometric shapes and references (such as perpendicularity and parallelism), when associated with words such as "approximately" or other similar terms such as "almost" or "substantially", are to be understood as excluding measurement errors or inaccuracies due to production and/or manufacturing errors and, above all, as excluding a slight deviation from the value, measurement, shape or geometric reference with which it is associated. For example, these terms, when associated with a value, preferably indicate a deviation of no more than 10% of the value.

Moreover, when used, terms such as 'first', 'second', 'upper', 'lower', 'main' and 'secondary' do not necessarily identify an order, priority of relationship or relative position, but can simply be used to more clearly distinguish different components from each other.

Unless otherwise specified in the following discussions, terms such as "processing", "computing", "determination", "calculation", or the like, are considered to refer to the action and/or processes of a computer or similar electronic computing device that manipulates and/or transforms data represented as physical quantities, such as electronic quantities of registers of a computer system and/or memories in, other data similarly represented as physical quantities within computer systems, registers or other information storage, transmission or display devices.

Measurements and data reported in this text are, unless otherwise indicated, to be considered as performed in ICAO International Standard Atmosphere (ISO 2533:1975).

With reference to the Figures, the measuring head according to the invention is globally indicated by the number 1.

The head 1 is an instrument primarily suitable for detecting and quantifying the displacement to which a part is subjected, e.g. in relation to surface characteristics or the movement of a body 10.

Body 10 may be a fixed body, flat or squat or of any other shape. Or, body 10 may be a rotating body, e.g. cylindrical, having its own roughness and possibly suffering from imbalance.

Therefore, head 1 includes, by and large, at least one frame 2.

Frame 2 is essentially a support frame. Therefore, it is configured to support the overall structure of frame 1.

For example, frame 2 may be a structure fixed to the ground or to a plane or other supporting element. Thus, frame 2 may be supported by or attached to the ground or to a plane or wall.

In addition, cartridge 1 includes at least one arm 3.

The arm 3 is substantially the movable head portion 1. In particular, preferably and as more fully set forth below, the arm 3 is the portion of the cartridge 1 that oscillates or swings in relation to the interference of the cartridge 1 with the body 10.

Preferably, moreover, arm 3 is essentially an elongated element, for example a rod or bar or similar element. Preferably, in fact, the arm 3 extends along a trajectory 3a.

Trajectory 3a may be a straight trajectory, or it may be curved. Or, trajectory 3a may also be more tortuous, possibly segmented into linear portions. In this sense, arm 3 may define L-shapes, U-shapes in whole or in part.

In any case, preferably, arm 3 develops, along trajectory 3a, at least between a first extreme 30 and a second extreme 31.

Ends 30, 31 are to be understood as substantially opposite portions of arm 3. They may exactly coincide with the opposite free ends of arm 3, or they may be opposite but intermediate portions, i.e. not exactly coinciding with the free ends.

Arm 3 therefore includes a probe 32. The touch probe 32 is the portion of the arm 3, and thus of the head 1, suitable for contacting the outer body 10. The probe 32 is therefore preferably arranged at one of the ends 30, 31, for example particularly at the first end 30.

In detail, the touch probe 32 may be integrated into the first endpoint 30, or it may be constrained at the first endpoint 30. Preferably, the touch probe 32 is removably constrained at the first endpoint 30.

In addition, probe 32 is configured to traverse, in a controlled manner, along a positioning axis 32a with respect to the first end 30.

The positioning axis 32a is substantially transverse to the trajectory 3a. Thus, the touch probe 32 may be constrained such that it is movable relative to the arm 3. For example, the arm 3 could comprise a threaded slot and the touch probe 32 could comprise a screw translatable along the positioning axis 32a by means of a rotation. Or, other configurations known to the current state of the art could be adopted.

In general, preferably, touch probe 32 has a blunt tip, suitable for interacting with body 10. In addition, it defines with the arm 3 a kind of hammer.

As already mentioned, arm 3 is the swinging part of cartridge 1.

Preferably, to enable this, the head 1 comprises constraint means 4. The constraint means 4 are substantially configured to loosely bind the frame 2 and the arm 3 in such a way that the arm 3 is rotatable with respect to the frame 2.

In detail, preferably, arm 3 is rotatable with respect to frame 2 around a pivot axis 4a.

The axis of rotation 4a is preferably transverse to the trajectory 3a. Furthermore, the axis of rotation 4a is preferably located between the extremes 30, 31. In particular, the axis of rotation 4a may be located exactly at a point equidistant from the extremes 30, 31. Or, preferably, the distances between the second extremity 31 and the rotation axis 4a and the first extremity 30 and the rotation axis 4a respectively define a ratio between 0.76 and 0.86. Even more conveniently, the ratio could be 0.81.

The constraint means 4 may therefore comprise a mechanical hinge defining the axis of rotation 4a, or may comprise deformable elements capable of permitting rotation of the arm 3 by elastic deformation, or may comprise a plurality of elastic elements, for example springs, connected between the frame 2 and the arm 3 at a plurality of points separated in such a way as to nevertheless permit rotation of the arm 3, with respect to the frame 2, at least about the axis of rotation 4a.

Or elastomeric elements can be provided.

In any case, in general, the arm 3 rotates about the axis of rotation 4a, relative to the frame 2, in proportion to displacements defined by the interaction of the touch probe 32 with the body 10.

Advantageously, head 1 includes an additional element. Specifically, head 1 comprises a capacitive sensor 8.

The capacitive sensor 8 is of the differential type. As such, it is configured to utilise the transmission of variable signals in relation to the capacitance of sensor 8 elements that are essentially similar to electrical capacitors.

The capacitive sensor 8 thus comprises at least one emitter 5 and one receiver 6.

The emitter 5 is preferably integral with the frame 2. Furthermore, it is disposed in proximity to the second end 31. By the term proximity it is meant that, in accordance with what is subsequently described, the emitter 5 is not in contact with the second end 31, but is sufficiently close to interact electrically with it, or with what is connected or bound to the second end 31.

In particular, the emitter 5 preferably defines a first emission zone 5a and a second emission zone 5b. Emission zones 5a and 5b essentially perform the same functions.

Preferably, they are configured to emit electrical source signals. In detail, the electrical signals are preferably sinusoidal. Furthermore, they advantageously define equal frequency and amplitude for each emission zone 5a, 5b.

However, still advantageously, the source signals of emission zones 5a, 5b are in phase opposition to each other.

From a structural point of view, however, the emission zones 5a, 5b are distributed, mutually separated, parallel or along a main direction 5c.

The main direction 5c is preferably transverse to the trajectory 3a. Furthermore, in detail, since the arm 3 is oscillating around the rotation axis 4a, the main direction 5c is preferably tangent to, or otherwise interfering with, the trajectory defined by the second end 31 during the oscillations. In other words, the emission zones 5a, 5b are positioned in the vicinity of the oscillation zone of the second end 31 and are mutually overlapping and separated from each other.

More specifically, to realise emitter zones 5a, 5b, emitter 5 may include a support 50.

The support 50 is preferably a flat element. It may therefore be a plate or a flap positioned in the vicinity of the second end 31.

Figure 2:
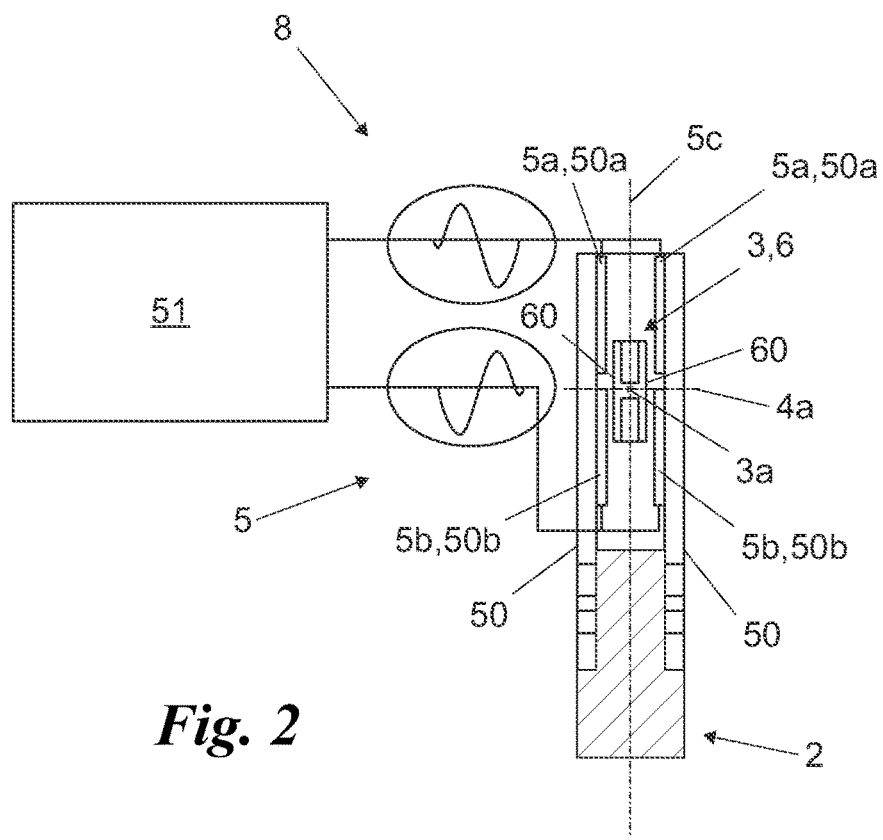
FIG. 2 illustrates a rear section view of the differential capacitive sensor of a measuring head according to the invention.

Furthermore, the support 50 preferably extends parallel to the trajectory 3a, i.e. at least partly on the side of the arm 3, as shown for example in FIG. 2. Furthermore, the support 50 also extends parallel to the main direction 5c.

Thus, support 50 comprises a first armature 50a and a second armature 50b.

The first armature 50a and the second armature 50b are essentially capacitor armatures. Therefore, they are capable of transmitting an electrical signal when flanked by an additional armature.

The first armature 50a essentially defines the first emission zone 5a. The second armature 50b essentially defines the second emission zone 5b.

Thus, the armatures 50a, 50b are developed on the support 50 and may be parts of it or constrained on it.

Emitter 5 also preferably includes a generator 51.

Generator 51 is essentially an electrical generator. In detail, it is a generator of sinusoidal signals, and thus of source signals. Thus, the generator 51 is preferably operatively connected to each of the armatures 50a, 50b. Furthermore, the generator 51 is configured to supply the armatures 50a, 50b with source signals. Receiver 6 is preferably integral with the second end 31.

In particular, the receiver 6 can be integrated into the second end 31, or it can be bound to the second end 31, or it can be removably bound to the second end 31.

For example, in the latter configuration, the receiver 6 may comprise a slat that can be bound to a slot made on the arm 3 at the second end 31 by conventional means of joining, such as screws and bolts or other similar means.

Advantageously, the receiver 6 is configured to receive source signals, capacitively i.e., non-contact, when transiting one or more emission zones 5a, 5b. Furthermore, the receiver 6 is configured to define resultant signals, from the source signals, proportional to its position with respect to the emission zones 5a, 5b.

Each resulting signal can simply be defined by the arithmetic sum of the contributions of each source signal.

From a structural point of view, receiver 6 includes a third armature 60 to do this. The third armature 60, like the other armatures 50a, 50b is essentially a capacitor armature. Furthermore, the third armature 60 runs parallel to the armatures 50a, 50b. Thus, the receiver 6 being solidly oscillating at the second end 31, the third armature 60 moves between the armatures 50a, 50b defining a plurality of positions in which it interacts differently with them, essentially completing the structure of a capacitor.

In other words, the third armature 60 defines with each armature 50a, 50b a moving armature capacitor. The movement, of course, has an impact on the capacitance and thus on the amplitude of the source signals transmitted from emitter 5 to receiver 6, in detail locally from each emitting zone 5a, 5b to receiver 6.

To increase detection accuracy, the head 1 could also comprise two supports 50. If present in number of two, the supports 50 are mirrored to each other. Thus, the receiver 6 preferably also comprises two third armatures 60.

The third armatures 60 are, in particular, preferably positioned at opposite sides.

Thus, the third armatures 60 each face towards a respective support 50.

In addition, the distance between the first armature 50a and the second armature 50b is preferably less than the extension defined by the third armature 60 along the main direction 5c.

In this way, the distance is no greater than the third armour 60 and the latter, when between armours 50a, 50b can preferably not define a zone of non-interaction with both simultaneously.

Advantageously, the capacitive sensor 8 also includes a processor 7.

Computer 7 is basically an electronic device capable of receiving and manipulating electrical signals to return signals or output data useful, for example, to an operator using head 1.

Computer 7 may comprise a computer, a computer, a simple circuit board and generally any organ capable of performing electronic computation. In particular, the computer 7 comprises or is part of or acts by at least one oscilloscope.

In particular, preferably, computer 7 is operatively connected to receiver 6.

Thus, computer 7 is configured to determine position parameters of receiver 6 with respect to emitter 5. In particular, computer 7 determines position parameters from a predetermined reference position value.

The predetermined reference position value is essentially a start or zero value of the head 1. In other words, when receiver 6 is at the predetermined reference position value, arm 3 is essentially in a resting state.

Then, by evaluating the position parameter of receiver 6 against the reference position value, computer 7 is configured to determine the displacements of touch probe 32.

More specifically, in this regard, computer 7 is configured to determine the position parameters of receiver 6 in proportion to the resulting signals, i.e. the signals derived from the source signals.

Furthermore, preferably but not necessarily, the predetermined reference position value is defined between the emission zones 5a, 5b at a position where the receiver 6 defines a substantially null resultant signal. Of course, this last characteristic corresponds to a calibration choice that could be different.

In general, this configuration is advantageous, and corresponds to the value position in which basically the cursor 6 is located between the armatures 50a, 50b exactly at a midpoint between them, because the source signals are signals with equal amplitude and frequency in counterphase which therefore cancel each other out, resulting in null signals, when the interaction between receiver 6 and first emission zone 5a is equal to the interaction between receiver 6 and second emission zone 5b or, in other words, when the surface of mutually facing third armature 60 and first armature 50a is substantially equal to the surface of third armature 60 and second armature 50b.

The operation of measuring head 1 described above in structural terms is as follows. Essentially, when the probe 32 is moved by the body 10, for example due to surface irregularities or due to the movement of the body 10 itself or even due to imbalances during the rotation of the body 10, the arm 3 oscillates, rotating about the axis of rotation 4a, in proportion to the movement of the probe 32. In turn, the second end 31, and thus the receiver 6, moves with respect to the emitter 5. Thus, the receiver 6 creates differences in capacitance in relation to the emission zones 5a, 5b which result in variations in the source signals and thus in variations in the resulting signals.

Figure 3:
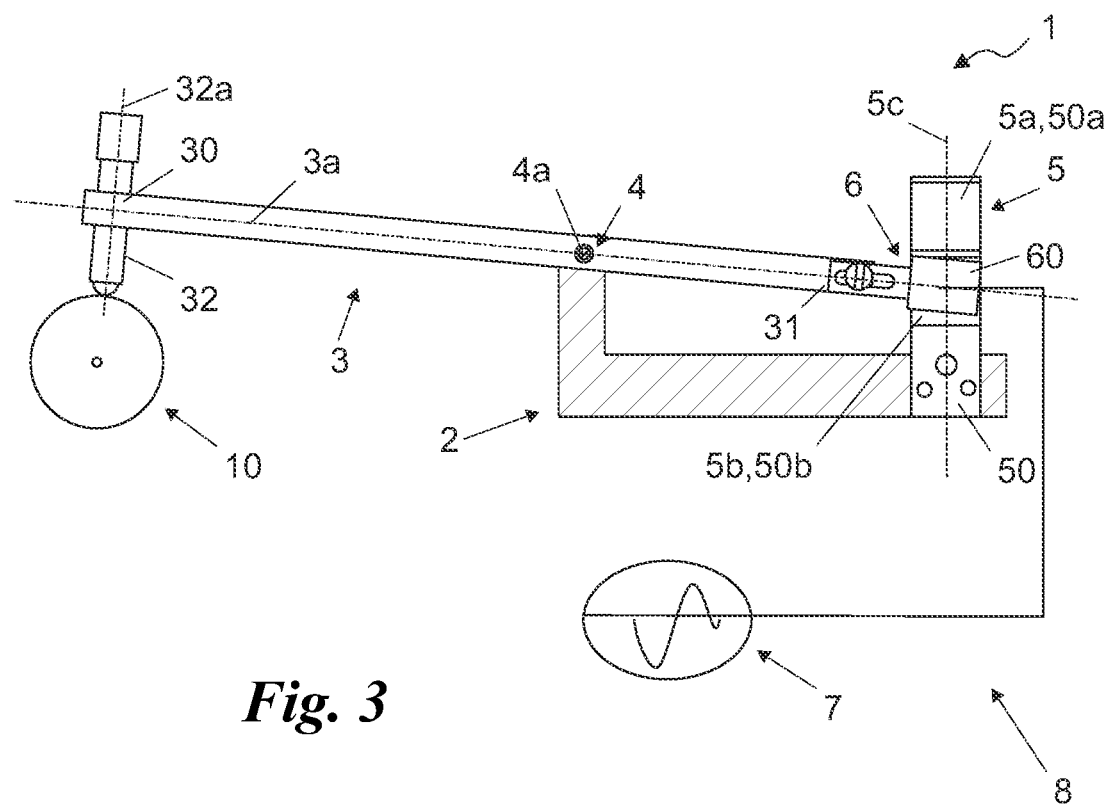
FIG. 3 is a schematic side view of a measuring head according to the invention with the cursor positioned at the minimum position value in which the cursor is positioned at only the second emission zone and defines a resulting signal having a maximum amplitude and a determined phase.

For example, when computer 7 measures the movement of the receiver in the situation of FIG. 3, cursor 6 interacts with only the second emission zone 5b and, therefore, the resulting signal corresponds only to the source signal of the second emission zone 5b at maximum amplitude.

Figure 4:
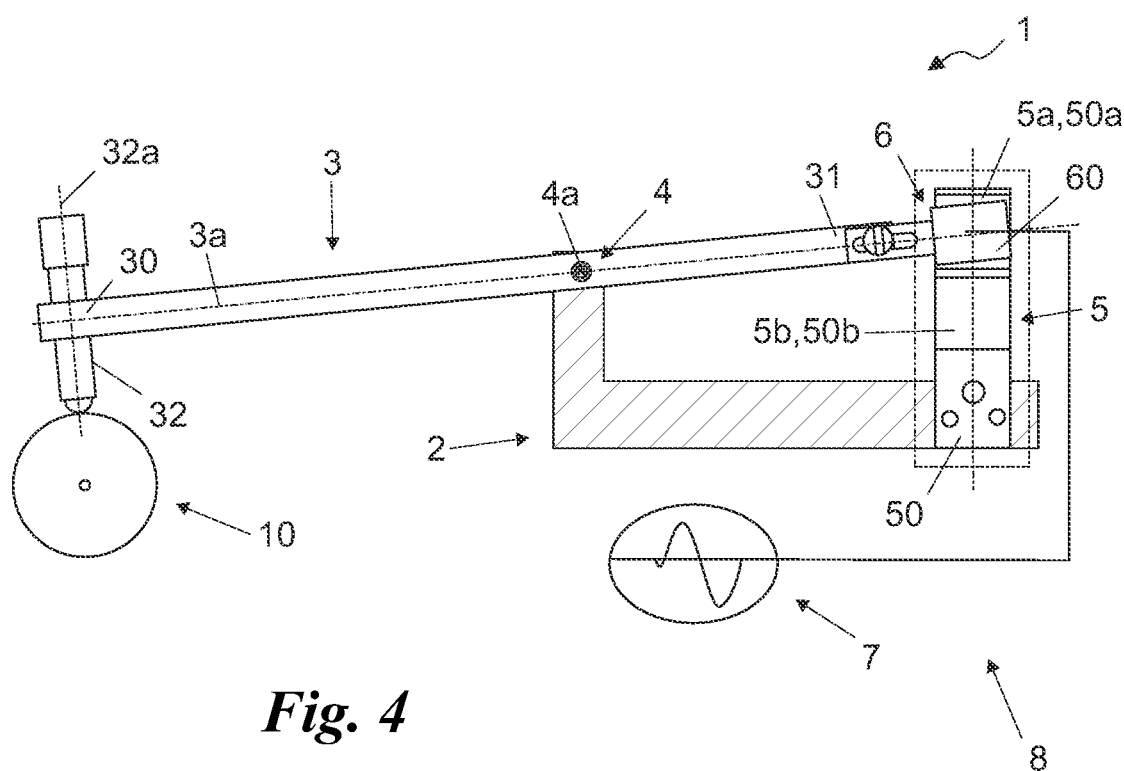
FIG. 4 depicts a schematic side view of a measuring head according to the invention with the cursor positioned at the minimum position value in which the cursor is positioned at the first emission zone only and defining a resultant signal having a maximum amplitude and in counterphase to the signal defined by the head of FIG. 3.

Conversely, when computer 7 measures the movement of the receiver in the situation of FIG. 4, cursor 6 interacts with only the first emission zone 5a and, therefore, the resulting signal corresponds only to the source signal of the first emission zone 5a at maximum amplitude.

In all intermediate situations, the different amplitudes resulting from the capacitance variations between third armature 60 and armatures 50a, 50b result in resultant signals in which the out-of-phase components, with their own amplitudes, of the source signals are added (and thus subtracted).

Computer 7 is then configured to translate the resulting signal into a linear measurement that essentially represents the movement of touch probe 32 interacting with body 10.

The measuring head 1 according to the invention achieves important advantages.

In fact, head 1 is simple and inexpensive to produce.

In addition, measuring head 1 is not affected by any mechanical limitations or impediments and allows for greater travel, i.e. greater displacements, as any arm 3 with a distance between first end 30 and pivot axis 4a even greater and thus greater travel can be used, simply by balancing the weights of the various arm portions 3.

In addition, measuring head 1 has reduced mechanical dimensions.

In conclusion, because of the way the signals are received, measuring head 1 allows the measurement to be linearised in a non-burdensome manner.

The invention is susceptible to variations within the inventive concept as defined by the claims.

Here, all details can be replaced by equivalent elements and the materials, shapes and sizes can be any.

The invention claimed is:

1. Measuring head including:
   a support frame,
   an arm extending along a trajectory at least between a first end and a second end and including at least one probe arranged at said first end and suitable for contacting an external body,
   constraint means configured to loosely bind said frame and said arm in such a manner that said arm is rotatable with respect to said frame about an axis of rotation, transverse to said trajectory, in proportion to displacements defined by the interaction of said probe with said body,
   a capacitive differential sensor including:
      an emitter integral with said frame and disposed in proximity of said second end,
      a receiver integral with said second end, and
      a computer operatively connected to said receiver and configured to determine position parameters of said receiver with respect to said emitter from a predetermined reference position value so as to determine said displacements of said probe.

2. Measuring head according to claim 1, wherein said emitter defines at least a first emission zone and a second emission zone distributed, mutually separated, parallel to or along a main direction transversal to said trajectory and configured to emit sinusoidal electrical source signals, of equal frequency and amplitude, in phase opposition, said receiver is configured to receive said source signals capacitively when transiting said one or more of said emission zones (5a, 5b) so as to define resultant signals proportional to its position with respect to said emission zones (5a, 5b), and said processor is configured to determine said position parameters of said receiver proportional to said resultant signals.

3. Measuring head according to claim 2, wherein said emitter comprises at least one flat support, extending parallel to said trajectory and including a first armature, defining said first emission zone, and a second armature, defining said second emission zone, extending on said support, and an electrical generator of sinusoidal signal operatively connected to each of said armatures (50a, 50b) and configured to feed said armatures (50a, 50b) with said source signals.

4. Measuring head according to claim 3, wherein said receiver comprises a third armature developing parallel to said armatures (50a, 50b).

5. Measuring head according to claim 4, comprising two said supports mutually facing each other specularly and said receiver comprising two said third armatures, at opposite sides, and each facing a respective said support.

6. Measuring head according to claim 4, wherein the distance between said first armature and said second armature is less than the extension defined by said third armature along said main direction.

7. Measuring head according to claim 1, wherein said predetermined reference position value is defined between said emission zones (5a, 5b) at a position wherein said receiver defines a substantially null resultant signal.

8. Measuring head according to claim 1, wherein said receiver is removably bound to said second end.

9. Measuring head according to claim 1, wherein said touch probe is removably constrained to said first end and configured to translate, in a controlled manner, along a positioning axis transverse to said trajectory with respect to said first end.

10. Measuring head according to claim 1, wherein the distances respectively between said second end and said axis of rotation and said first end and said axis of rotation define a ratio between 0.76 and 0.86.

* * * * *